United States Patent
Golz et al.

(10) Patent No.: US 6,816,397 B1
(45) Date of Patent: Nov. 9, 2004

(54) BI-DIRECTIONAL READ WRITE DATA STRUCTURE AND METHOD FOR MEMORY

(75) Inventors: John W. Golz, Garrison, NY (US); David R. Hanson, Brewster, NY (US); Hoki Kim, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/448,776

(22) Filed: May 29, 2003

(51) Int. Cl.[7] .............................. G11C 5/02; G11C 5/06; G11C 7/00; G11C 7/02

(52) U.S. Cl. .......................... 365/51; 365/63; 365/203; 365/207

(58) Field of Search ............................ 365/51, 63, 203, 365/205, 207, 208, 230.03, 230.06

(56) References Cited

U.S. PATENT DOCUMENTS

| | | | | |
|---|---|---|---|---|
| 4,716,550 A | * | 12/1987 | Flannagan et al. | 365/207 |
| 5,627,789 A | * | 5/1997 | Kalb, Jr. | 365/205 |
| 5,732,042 A | * | 3/1998 | Sunaga et al. | 365/63 |
| 5,742,552 A | * | 4/1998 | Greenberg | 365/205 |
| 5,982,673 A | * | 11/1999 | Kiehl | 365/207 |
| 6,188,596 B1 | * | 2/2001 | Holst | 365/63 |
| 6,504,766 B1 | * | 1/2003 | Pilo et al. | 365/207 |

* cited by examiner

Primary Examiner—Trong Phan
(74) Attorney, Agent, or Firm—Daryl K. Neff; H. Daniel Schnurmann

(57) ABSTRACT

As disclosed herein, an integrated circuit memory is provided which includes primary sense amplifiers coupled for access to a multiplicity of storage cells, second sense amplifiers, and pairs of input/output data lines (IODLs), each IODL pair being coupled to a primary sense amplifier, and each IODL pair carrying complementary signals representing a storage bit. The memory further includes pairs of bi-directional primary data lines (BPDLs), each BPDL pair being coupled to a second sense amplifier and each BPDL pair being adapted to carry other complementary signals representing a storage bit. Local buffers are adapted to transfer, in accordance with control input, the complementary signals carried by the IODLs to the BPDLs, and vice versa.

20 Claims, 5 Drawing Sheets

BI-DIRECTIONAL READ WRITE DATA STRUCTURE AND METHOD FOR MEMORY

FIELD OF THE INVENTION

The present invention relates to integrated circuit memories, and more particularly to a system and method, in a semiconductor integrated circuit memory, of transferring read and write data signals on a bi-directional primary data line between primary sense amplifiers and secondary sense amplifiers.

BACKGROUND OF THE INVENTION

In a typical integrated circuit memory, the maximum speed of memory access from outside the memory is determined by the performance of the memory array. The speed of access in reading data from the memory cell array and writing data to the array is a limiting factor, both of which are heavily affected by the particular architecture for transferring read and write data signals to and from the memory cell array. Dynamic random access memories (DRAMs) represent a particularly dense form of integrated circuit memory in which a large amount of storage can be provided within a small area of an integrated circuit, making DRAMs an attractive option for low-cost, electronic memory, whether provided in a separate chip, or as an embedded memory of a system-on-a-chip (SOC) integrated circuit.

Static random access memories (SRAMs) have generally faster access times than DRAMs, but are much less dense than DRAMs, because SRAMs require a minimum of six transistors per memory cell, all of which extend in the plane of the integrated circuit chip. On the other hand, DRAMs require only one transistor per memory cell, which is oriented vertically in state of the art DRAMs to conserve chip area. It is apparent that in order for DRAMs to compete effectively with fast access time (SRAM), especially in SOC integrated circuits, that DRAMs must provide fast access to stored information, while preserving advantages over SRAM as to density and quantity of storage.

Moreover, recently, there has been a trend towards hybrid types of memory. For example, a content addressable memory can be designed having storage cells composed of one transistor-one capacitor cells similar to that of dynamic random access memories. In addition, other than DRAMs, other types of memories have utilized architecture similar to that of DRAMs as a method of reading and writing to storage cells of the memory, namely, in that data signals are transferred to and from storage cells and an external interface of the memory by way of a series of sense amplifiers.

Conventional integrated circuit memories utilize separate read and write data buses. These solutions occupy larger silicon area and impede aggressively dense chip/macro targets.

As illustrated in FIGS. 1A and 1B, a conventional configuration for a multi-banked DRAM is shown, which can be either a stand-alone memory, or an embedded DRAM macro within a larger chip. As shown in FIG. 1A, the multi-banked DRAM includes a plurality of banks BANK<0> through BANK<15>, and a write driver 12, and an off-chip driver 14. As shown in the inset of FIG. 1B, each bank of the DRAM 10, for example, BANK<xx>, includes a storage cell array 16, at least one first sense amplifier block 18 having a plurality of first sense amplifiers, and at least one local buffer block having a plurality of local buffers 20. The purpose of the sense amplifiers of the first sense amplifier block 18 is to transfer signals to and from storage cells of the storage cell array 16 on respective bitline pairs (BLP) of a plurality of bitline pairs. Transfer of signals between the sense amplifiers of the first sense amplifier block 18 and the block 20 of local buffers is performed as follows. The read output signals of a number of sense amplifiers of the first sense amplifier block, for example four, or eight sense amplifiers, are multiplexed into a local buffer block 20 as selected by column select lines (CSL) and the write input signals to that same number of sense amplifiers of the first sense amplifier block are demultiplexed out of the local buffer block 20 as selected by the column select lines (CSL), respectively. The input and output signal lines of the local buffer block 20, in turn, are multiplexed onto read primary data lines RPDL, and demultiplexed from complementary write primary data lines WPDLt and WPDLc, respectively. As shown in FIG. 1A, these input output buses: the read primary data lines and the write primary data lines run the length of the memory 10 over all of the banks to further circuitry within off-chip driver 14 and write driver 12 which handle the transfer of write data signals to and from the memory 10. The read primary data line (RPDL) is connected to an off-chip driver block 14, while the write primary data lines (WPDLc and WPDLt) originate from the write driver 12.

Operation of the conventional DRAM 10 varies as to whether data is being read from or written to an array of the memory 10, in that separate read and write buses are used for reading data from, and writing data to the memory 10. A read/write control signal (WR/RDN) is provided for controlling whether the array 16 is read from or written to. In read mode, a data bit from a storage cell of the array 16 is transferred via a first sense amplifier of FSA block 18 to a local buffer of LBF block 20. From there, an amplified data signal is transferred onto the RPDL bus, from which the signal is further transferred to an off-chip driver block 14. In write mode, the data to be written into a storage cell of an array 16 is provided to a write driver 12 of the memory 10. From there, the data bit is transmitted onto the write primary data lines WPDLt and WPDLc and through the LBF 20 to the first sense amplifier blocks 18.

FIG. 2 is a schematic diagram illustrating a conventional arrangement for a local buffer 22, such as that used in LBF block 20 of DRAM 10. As illustrated, local buffer 22 provides output onto a read primary data line RPDL, which is separate from the lines on which write input is received, WPDLc and WPDLt. Local buffer 20 includes a cross-coupled pair of p-type field effect transistors (PFETs) P3 and P4, which act to drive the fan nodes FT and FC to complementary levels. Fan nodes FT and FC typically carry data signals which are multiplexed with respect to the storage cell array 16 of the memory 10, and which are demultiplexed as data signals are transferred to one of several first sense amplifiers with which the particular local buffer 20 is selectively switched. In addition, a pair of precharge PFETs P1 and P2 are provided for precharging the fan nodes FT and FC to the supply voltage between successive read or write cycles when the voltage at node PCN is driven low. In addition, a pair of pull-up PFETs P5 and P6 are provided to drive the voltage of a respective one of the fan nodes FT and FC up to a supply voltage, according write input received on complementary lines WPDLt and WPDLc. A device N3 is provided for controlling whether a read or write operation is to be performed. Specific read circuitry including NOR gates O1 and O2, inverter I1, and the output driver including PFET P7 and NFET N4, convert complementary read data on fan nodes FT and FC to a single output signal at RDPL.

Operation of the local buffer 22 proceeds as follows. Prior to a read or a write operation, the fan nodes FT and FC are precharged to a given potential such as a supply voltage VDD when the voltage at PCN is driven low. At that time, the primary read data line, RPDL, is tri-stated. The read operation begins such that a data signal from a storage cell of the array 16 appears on a bitline coupled thereto, and a first sense amplifier of FSA block 18 is then activated. The first sense amplifier amplifies a small voltage difference between the bitline and a complementary reference bitline to rail-to-rail complementary signals having a voltage difference of about 1V to 2V, depending upon the technology. In a typical DRAM 10, column select circuitry then selects the output of a particular first sense amplifier of a group of typically four or eight first sense amplifiers of FSA block 18 to be transferred to the multiplexed fan nodes FT and FC, through a pair of multiplexer switches (not shown).

Further operation then proceeds as follows. In an example, a logic level '1' is read from a storage cell of the array 16. The WR/RDN input is low to provide read operation. Complementary data signals arriving on a bitline pair BL and /BL from the selected first sense amplifier (not shown) of FSA block 18 are coupled to fan nodes FT and FC, respectively. Then, the fan node FC, which had been precharged there prior to the supply voltage VDD, is driven to ground. The cross-coupled PFETs P3 and P4 assist in quickly forcing fan node FC to ground, while fan node FT is forced to the supply voltage VDD. Because WR/RDN is at the low level, it enables NOR gates O1 and O2. Since both the fan node FC and the WR/RDN input to NOR gate O1 are low, its output is high. The high output of NOR gate O1 is inverted to low by inverter I1. As a result, PFET P7 turns on to drive the read primary data line, RPDL, to the supply voltage VDD. Meanwhile, NFET N4 is turned off by the low output of NOR gate O2, which results from fan node FT being at the high level.

The beginning of the write operation is similar to the read operation, in that the fan nodes FT and FC are first precharged to VDD by driving the voltage low at PCN. In an example, a logic level '0' is written to a storage cell of the memory array 16 of the DRAM 10. The WR/RDN signal is provided at the high level at the gate of NFET N3, and the complementary write primary data lines, WPDLt and WPDLc, are provided at the low '0' level and the high '1' level, respectively, from the write driver block 12. The high level on WPDLc causes NFET N2 to conduct and node FT is then driven to ground by the series NFETs N2 and N3. At the same time, PFETs P3 and P5 conduct and pull the fan node FC up to VDD. These data states of the fan nodes FT and FC are then transferred by multiplexer switches (not shown) to a bitline pair BL and /BL of a first sense amplifier of FSA block 18 for writing to a storage cell of the storage cell array 16.

SUMMARY OF THE INVENTION

According to an aspect of the invention, an integrated circuit memory is provided which includes a plurality of primary sense amplifiers coupled to provide read and write access to a multiplicity of storage cells, a plurality of second sense amplifiers, and a plurality of pairs of input/output data lines (IODLs) each coupled to a primary sense amplifier of the plurality of primary sense amplifiers. Each input output data line (IODL) pair is adapted to carry first complementary signals representing a storage bit. The integrated circuit memory further includes a plurality of pairs of bi-directional primary data lines (BPDLs), each bi-directional primary data line (BPDL) pair being coupled to a second sense amplifier of the plurality of second sense amplifiers, and each BPDL pair being adapted to carry second complementary signals representing a storage bit.

According to this aspect of the invention, in the integrated circuit memory, a plurality of local buffers are provided, each being responsive to read control input to transfer the first complementary signals carried by the IODLs to second complementary signals carried by the BPDLs, and each being responsive to write control input to transfer the second complementary signals carried by the BPDLs to first complementary signals carried by the IODLs.

According to another aspect of the invention, a method is provided for transferring a data bit signal between a primary sense amplifier and a secondary sense amplifier. The method includes providing a pair of input/output data lines (IODLs) coupled to a primary sense amplifier for carrying a pair of first complementary data signals. The method further includes transferring, in accordance with control input, a data bit signal between the pair of IODLs and a secondary sense amplifier by way of a pair of bi-directional primary data lines (BPDLs) carrying a pair of second complementary data signals.

DETAILED DESCRIPTION OF THE PREFERRED EMBODIMENTS

Figure 1B:
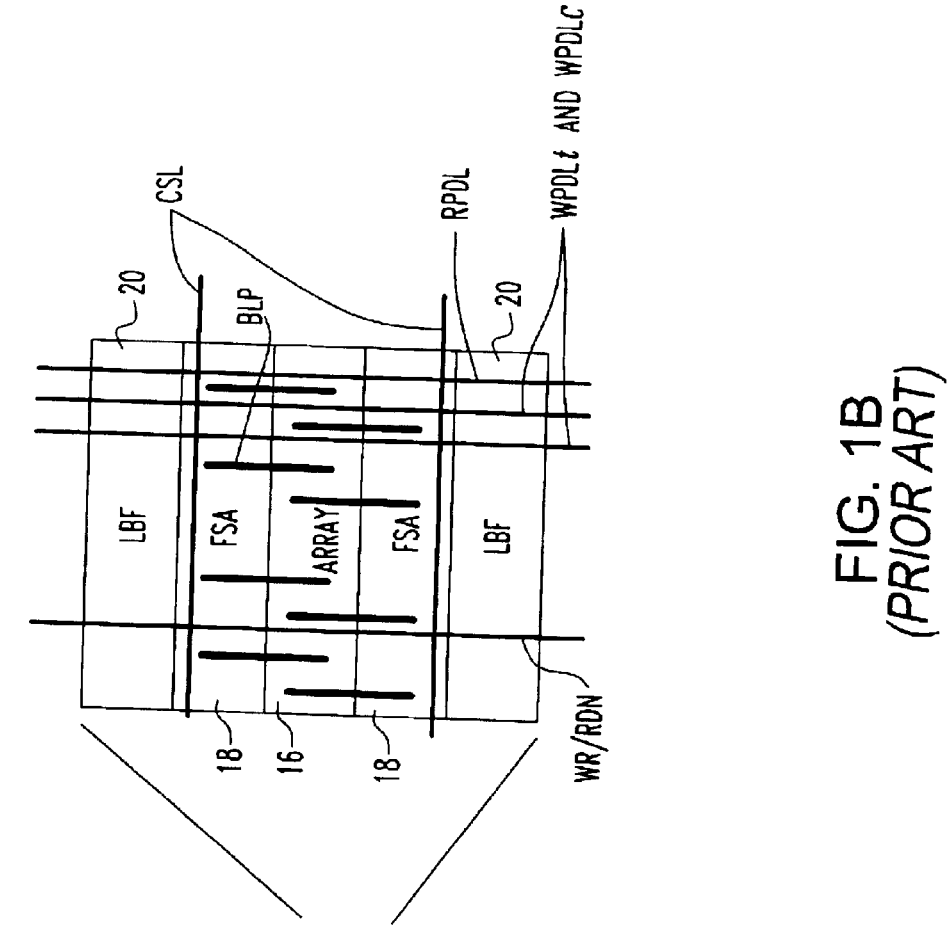
FIGS. 1A and 1B are block diagrams illustrating a prior art memory configuration.
Figure 1A:
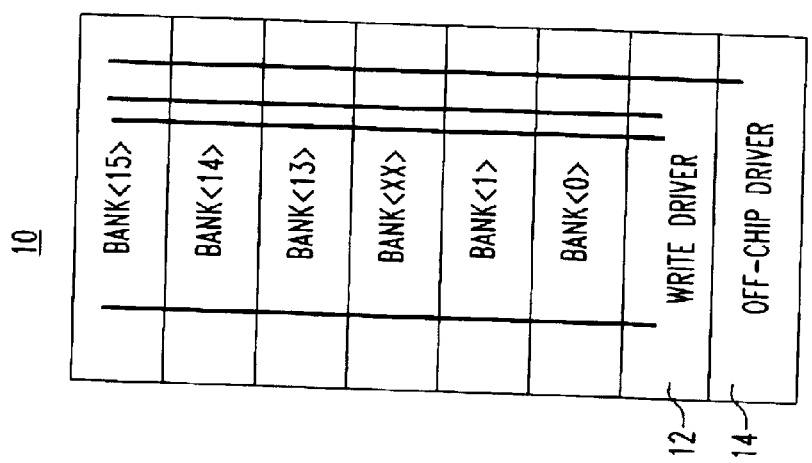
Figures 3A, 3B:
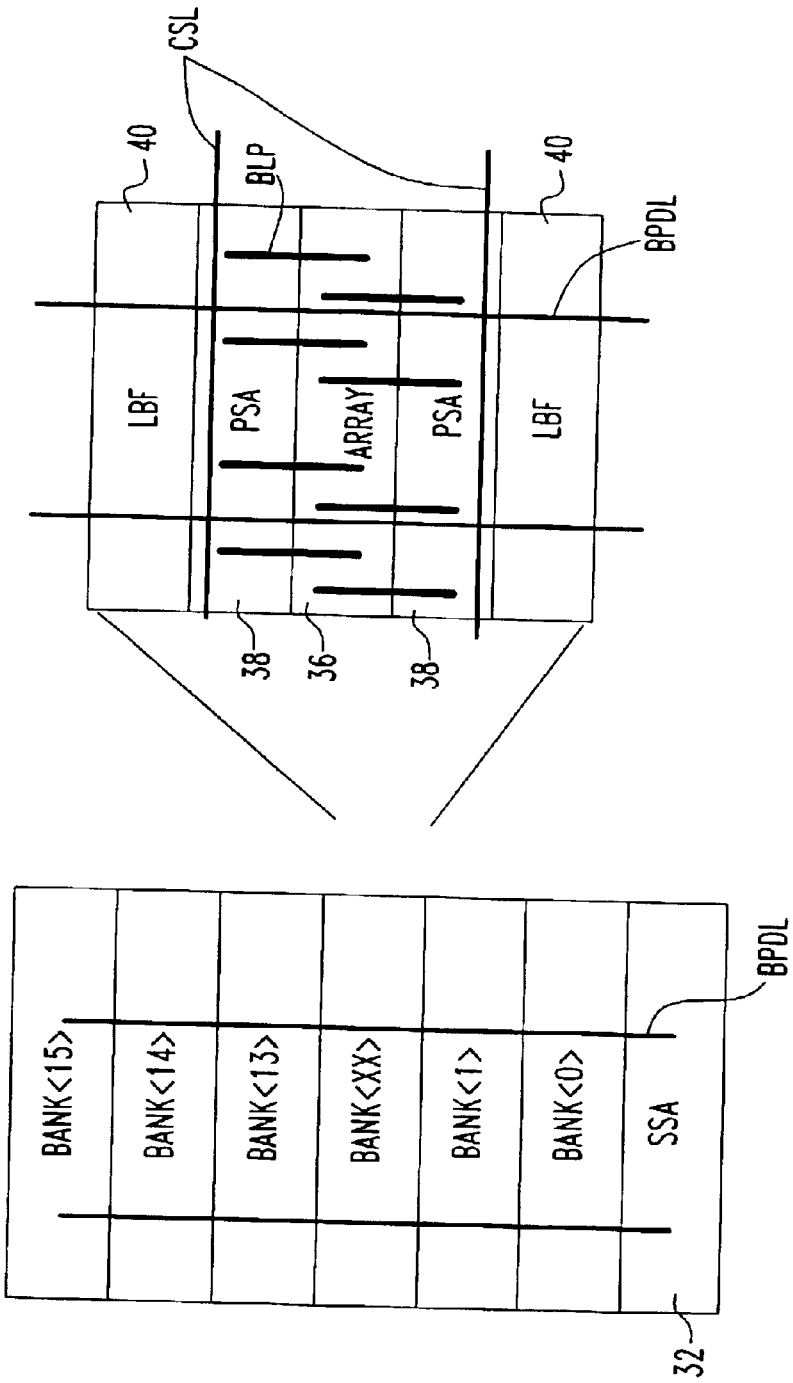
FIGS. 3A and 3B are block diagrams illustrating a memory configuration of an embodiment of the invention.

A first circuit embodiment will now be described, with reference to FIGS. 3A and 3B. In this embodiment, a multi-banked DRAM 30 is provided, which can be either a stand-alone memory, or an embedded DRAM macro within a larger chip. As shown in FIG. 3A, the multi-banked DRAM 30 includes a plurality of banks BANK<0> through BANK<15>, and a plurality of second sense amplifiers (SSA) 32 connected thereto, which replace the write driver 12, and off-chip driver 14 of the conventional DRAM shown in FIGS. 1A and 1B. A pair of bi-directional primary data lines, as shown at BPDL, runs between BANK <15>, BANK<0> and the second sense amplifiers 32. As shown in the inset of FIG. 3B, each bank of the DRAM 30, for example, BANK<xx>, includes a storage cell array 36, which is coupled to at least one primary sense amplifier block 38 having a plurality of primary sense amplifiers by a plurality of bitline pairs (BLP). Each bank further includes at least one local buffer (LBF) block 40 having a plurality of local buffers. The purpose of the primary sense amplifiers of the PSA block 38 is to transfer signals to and from storage cells of the storage cell array 36 on respective ones of the bitline pairs (BLP). As shown in FIG. 3B, a pair of bi-directional primary data lines (BPDL) runs over the BANK<xx>. Column select lines (CSL) are used to select which of the outputs of the primary sense amplifiers of primary sense amplifier block 38 is passed to local buffer (LBF) 40.

Transfer of signals between primary sense amplifiers of the PSA 38 and local buffers of LBF block 40 is arranged as follows, as further shown in FIG. 4. The read data output signals on preferably a plurality of complementary pairs of bitlines, e.g. bitline pair BL1 and /BL1 of a number of sense amplifiers SA1, SA2, . . . SAn of PSA block 38, for example two, four, or eight sense amplifiers, are multiplexed by multiplexer (MUX) switches 48 and 50 onto complementary fan nodes FT and FC, as input to a local buffer block 40 (FIG. 3B). A selection input SEL is provided, ultimately orginating from column select input (CSL), to select a particular bitline pair, e.g. BL1 and /BL1 of the plurality of bitline pairs, in multiplexed relation to the fan nodes FT and FC. Similarly, write data input signals to the same primary sense amplifiers of the PSA block 38 are demultiplexed onto a selected one of the complementary bitline pairs by the same MUX switches 48 and 50, from the multiplexed data carried by the fan nodes FT and FC of the local buffer block 40 (FIG. 3B). Alternatively, the write data input signals and the read data output signals for only a signal pair of bitlines are transferred by way of fan nodes FT and FC to and from a primary sense amplifier, respectively, without the multiplexing and demultiplexing of bitline signals. In either case, the fan nodes FT and FC function as bi-directional input output data lines ("IODLs") for transferring data to and from a primary sense amplifier.

As further shown in FIG. 3B, a pair of bi-directional primary data lines BPDL connects a local buffer from LBF block 40 to a second sense amplifier of SSA block 32. However, unlike the prior art arrangement shown in FIG. 1B, in this embodiment, the complementary write primary data lines (referenced as WPDLt and WPDLt in the arrangement shown in FIG. 1B) and the read primary data line, RPDL (FIG. 1B) have been combined and reduced to a pair of bi-directional data lines. In a DRAM 30 which already provides 256 input output ("IO") lines, 512 metal lines, i.e. two lines×256 IO lines are thus eliminated from the memory. The resulting savings in chip area can be used to broaden the remaining bi-directional primary data line pairs, thereby improving speed of both read and write access to the memory, or can be used to strengthen the power grid over the memory array 36, which contributes to performance.

Figure 2:
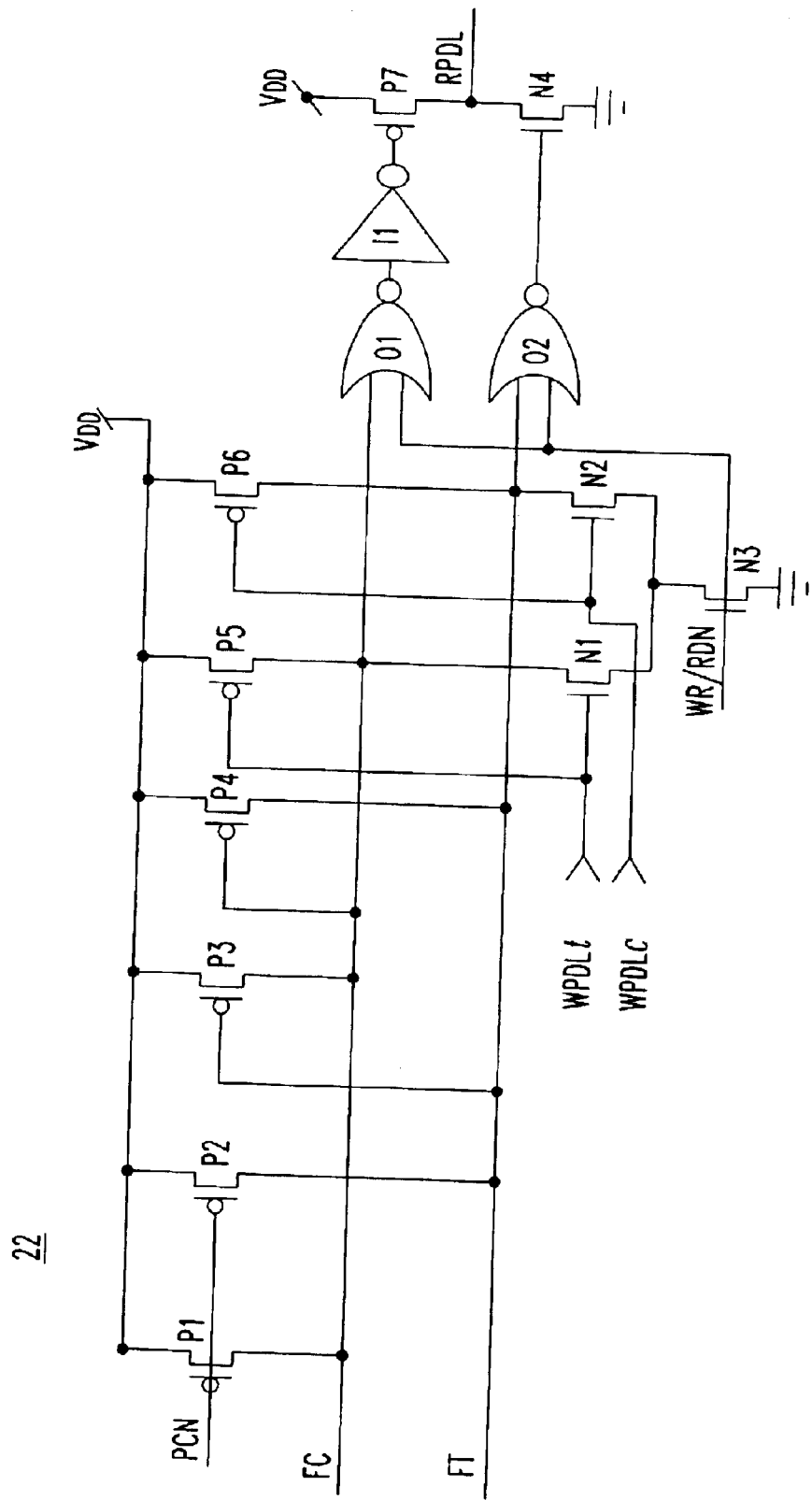
FIG. 2 is a schematic diagram illustrating a prior art local buffer, such as that used in the memory configuration shown in FIGS. 1A and 1B.
Figure 4:
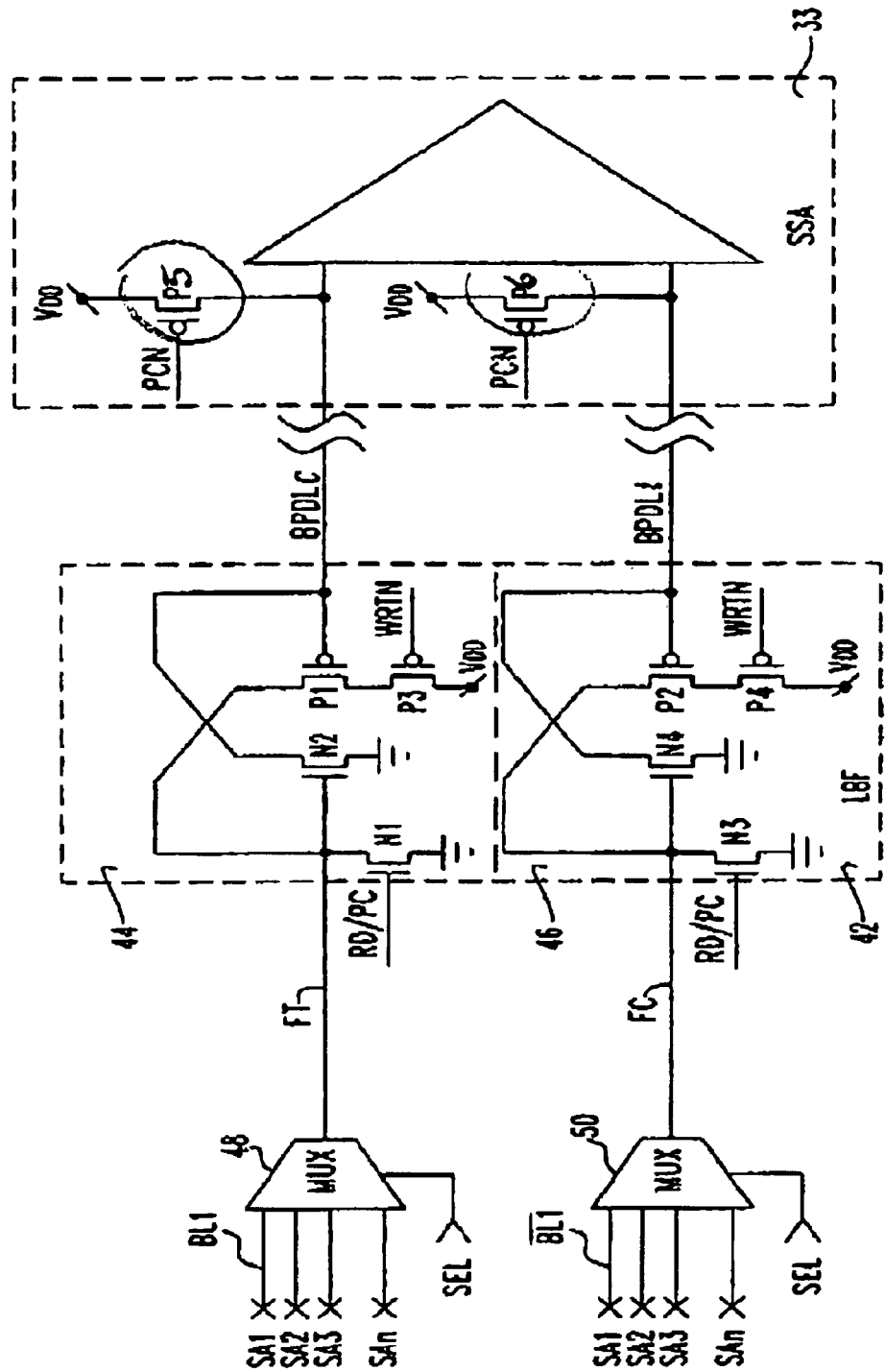
FIG. 4 is a schematic diagram illustrating an embodiment of the invention.

As shown in FIG. 4, a preferred embodiment of a local buffer 42 of LBF block 40 is illustrated schematically. Local buffer 42 operates bi-directionally, but contains fewer transistors than the prior art local buffer 22 shown and described above relative to FIG. 2, as there are no NOR gates O1, O2, separate read driver transistor pair (P7 and N4), or inverter I1 in this embodiment. As shown in FIG. 4, a local buffer 42 includes two circuits 44 and 46, each of which transfers read and write data signals bi-directionally between a fan node FT or FC in each case and the corresponding one of complementary bi-directional primary data lines BPDLt and BPDLc. Within a circuit 44, read and precharge timing control is provided through a signal RD/PC input to the gate of NFET N1. When the RD/PC signal is high, the fan node FT is precharged to ground by NFET N1 which turns on. On the other hand, when RD/PC is low, fan node FT is allowed to float to the potential of bitline being sensed by the primary sense amplifier of PSA block 18 connected thereto.

Fan nodes FT and FC are coupled in inverted relation to the bi-directional primary data lines BPDLc and BPDLt, respectively. Thus, a read data output signal appearing on fan node FT is inverted when transferred to BPDLc, and a write data input signal on BPDLc is inverted when transferred onto fan node FT. Similarly, a read data output signal appearing on the complementary fan node FC is inverted when transferred to BPDLt, and a write data input signal on BPDLt is inverted when transferred onto FC. The particular circuitry of local buffer 42 is provided as follows. The initial condition for read operation provides that BPDLc and BPDLt are precharged high. When enabled by a read signal RD at the gate of N1, a high signal appearing on FT is inverted onto BPDLc by NFET N2. On the other hand, the initial condition for a write operation provides that FT and FC are precharged low. When enabled by a write signal WRTN at the gate of P3, a low signal appearing on BPDLc is inverted onto FT by PFET P1 which is connected through PFET P3 to a voltage supply VDD to pull up the voltage on FT. The circuit 46 provided for transferring signals between FC and BPDLt are the same as that of the circuit 44.

A pair of PFETs P5 and P6 are provided for precharging the lines BPDLc and BPDLt, respectively. The PFETs are controlled by a switching signal PCN input to their gates. When PFETs P5 and P6 are arranged in such manner, the bi-directional primary data lines, BPDLt and BPDLc, are permitted to swing from rail to rail in each read or write access and/or be amplified at the SSA 33. In an alternative embodiment, the precharge devices P5 and P6 have gates that are held at ground. In the alternative arrangement, signal swing on the complementary lines BPDLt and BPDLc is limited, thus shortening the time for the complementary signals thereon to reach their final levels. Amplification of the complementary signals BPDLt and BPDLc to rail-to-rail signals would then be performed by SSA 33, By limiting signal swing in such manner, the performance and latency of the DRAM 30 can be improved.

In an example of operation, a storage cell of the memory array 36 is read out of the memory. With respect to local buffer 42 of FIG. 4, a read operation begins with the fan nodes FT and FC being precharged to ground by a high level input to N1 and N3. At about the same time, the bi-directional primary data lines BPDLt and BPDLc are precharged to VDD by low level inputs to PFETs P5 and P6. When a logic level '1' is read from a storage cell of the array 36, the fan node FT rises to the high level voltage of logic level '1'. The high level causes transistor N2 to conduct, thereby discharging the line BPDLc to ground. The fan node FC remains at ground, because it provides a complementary signal to the high level signal on FT. As a result, NFET N4 does not conduct and the line BPDLt remains high, at a logic level '1', indicating that a '1' is read from the storage cell of the array 36. On the other hand, when a logic level '0' is read from the memory cell, the fan node FC rises to the high level of a logic level '1'. The high level causes transistor N4 to conduct which discharges the line BPDLt to ground. The fan node FT remains at ground. As a result, NFET N2 does not conduct and the line BPDLc remains high, at a logic level '1', indicating that a '0' is read from the storage cell of the array 36.

In another example, a write operation is performed. The write operation begins with the fan nodes FT and FC being precharged to ground. The bi-directional primary data lines BPDLt and BPDLc are precharged to VDD through PFETs P5 and P6. When a logic level '1' is to be written to the storage array 36, the line BPDLc becomes low. At that time, the write control PFETs P3 and P4 are turned on by write control input WRTN. The low level on BPDLc causes transistor P1 to conduct, thereby pulling up the voltage on line FT to the supply voltage VDD, i.e. to logic level '1'. The line BPDLt remains at a high potential, such that PFET P2 does not conduct and fan node FC therefore remains at the complementary signal level of ground, i.e. at logic level '0'. On the other hand, when a logic level '0' is to be written to the memory cell, the line BPDLt becomes low, indicating logic level '0'. The low level on BPDLt causes PFET P2 to conduct, which then pulls the voltage of fan node FC up to the supply voltage, i.e. to logic level '1'. At that time, the line BPDLc remains at a high potential, such that PFET P1 does not conduct and fan node FT therefore remains at ground, i.e. at logic level '0'.

In the embodiment described above, the fan nodes FT and FC are precharged to ground and the bi-directional primary data lines BPDLt and BPDLc are precharged to the supply voltage VDD. In another embodiment, as described below relative to FIG. 5, the fan nodes FT and FC are precharged to VDD while the BPDL lines are precharged to ground. The circuits shown in FIG. 5 are similar in operation to those of FIG. 4.

Figure 5:
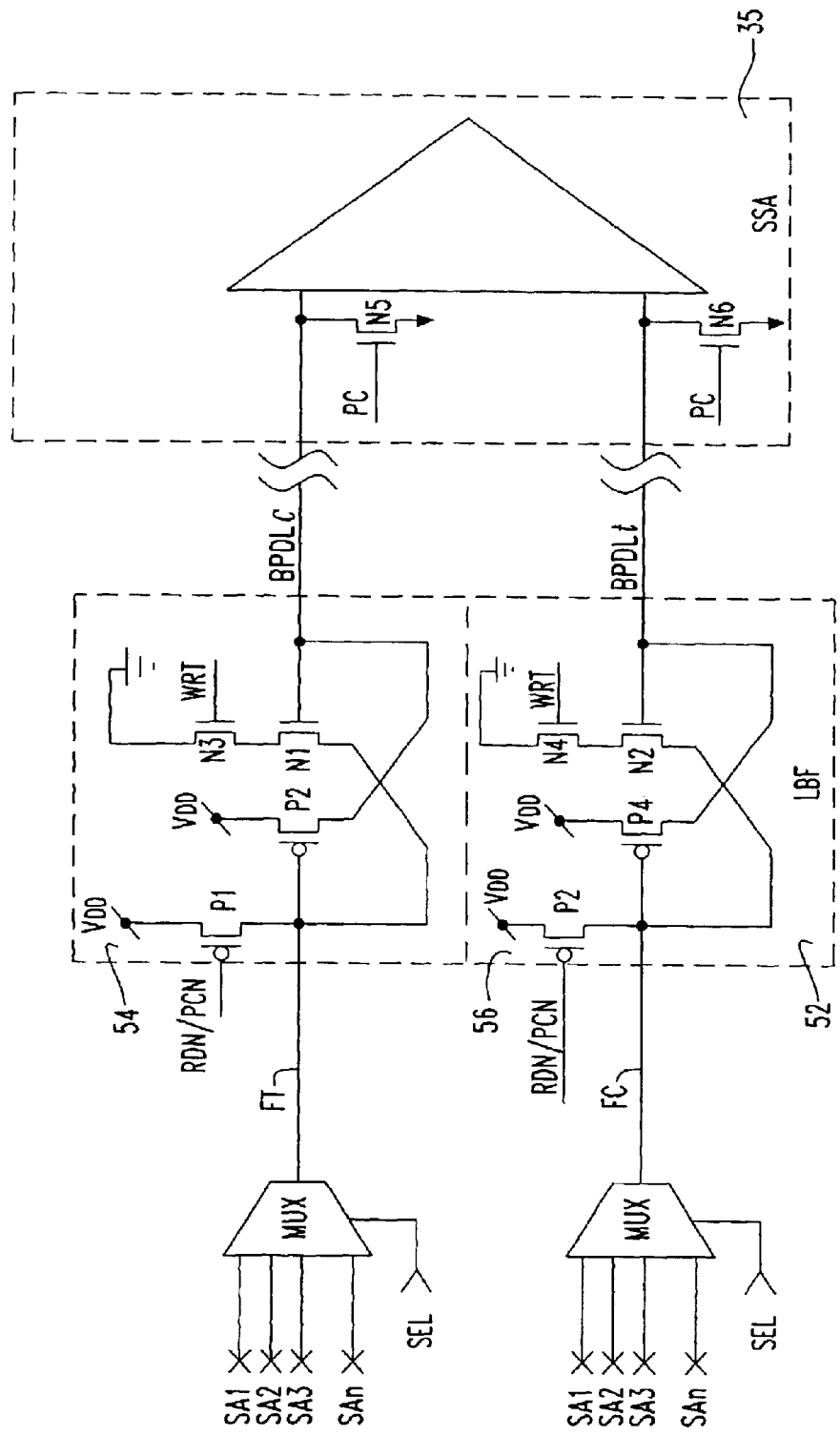
FIG. 5 is a schematic diagram illustrating another embodiment of the invention.

As shown in FIG. 5, in this embodiment, a local buffer 52 of LBF block 40 is illustrated schematically. Local buffer 52 operates bi-directionally. As shown in FIG. 5, a local buffer 52 includes two circuits 54 and 56, each of which transfers read and write data signals bi-directionally between a fan node FT or FC in each case and the corresponding one of complementary bi-directional primary data lines BPDLt and BPDLc. Within a circuit 54, read and precharge timing control is provided through a signal RDN/PCN input to the gate of PFET P1. When the RDN/PCN signal is low, the fan node FT is precharged to a supply voltage VDD by PFET P1 which turns on. On the other hand, when RDN/PCN is high, fan node FT is allowed to float to the potential of bitline being sensed by the primary sense amplifier of PSA block 38 connected thereto.

As shown in FIG. 5, fan nodes FT and FC are coupled in inverted relation to the bi-directional primary data lines BPDLc and BPDLt, respectively. Thus, a read data output signal appearing on fan node FT is inverted when transferred to BPDLc, and a write data input signal on BPDLc is inverted when transferred onto fan node FT. Similarly, a read data output signal appearing on the complementary fan node FC is inverted when transferred to BPDLt, and a write data input signal on BPDLt is inverted when transferred onto FC. The particular circuitry of local buffer 52 is provided as follows. The initial condition for read operation provides that BPDLc and BPDLt are precharged low. A high level read signal RDN is provided to the gate of P1 when the local buffer 52 is enabled. At that time, a low signal appearing on FT is inverted onto BPDLc by PFET P2. On the other hand, the initial condition for a write operation provides that FT and FC are precharged high. When enabled by a write signal WRT at the gate of an NFET N3, a high signal appearing on BPDLc is inverted to a low signal appearing on FT by NFET N1 which is connected through NFET N3 to pull down the voltage on FT to ground. The circuit 56 provided for transferring signals between FC and BPDLt are the same as that of the circuit 44.

A pair of NFETs N5 and N6 are provided for precharging the lines BPDLc and BPDLt, respectively. The NFETs are controlled by a switching signal PC input to their gates. When NFETs N5 and N6 are arranged in such manner, the bi-directional primary data lines, BPDLt and BPDLc, are permitted to swing from rail to rail (logic level '0' to logic level '1': from ground to VDD) in each read or write access and/or be amplified at the SSA 35. In an alternative embodiment, the precharge devices N5 and N6 have gates that are held at the supply voltage, e.g. VDD. In the alternative arrangement, signal swing on the complementary lines BPDLt and BPDLc is limited, thus shortening the time for the complementary signals thereon to reach their final levels. Amplification of the complementary signals BPDLt and BPDLc to rail-to-rail signals would then be performed by SSA 35, By limiting signal swing in such manner, the performance and latency of the DRAM 30 can be improved.

In an example of operation, a storage cell of the memory array 36 (FIG. 3B) is read out of the memory. With respect to local buffer 52 of FIG. 5, a read operation begins with the fan nodes FT and FC being precharged to the supply voltage VDD by a low level inputs to P1 and P2. At about the same time, the bi-directional primary data lines BPDLt and BPDLc are precharged to ground, by high level input to NFETs N5 and N6. When a logic level '0' is read from a storage cell of the array 36, the fan node FT falls to the low level voltage of logic level '0'. The low level causes transistor P2 to conduct, thereby charging the line BPDLc to the supply voltage VDD. The fan node FC remains high, because it provides a complementary signal to the low level signal on FT. As a result, PFET P4 does not conduct and the line BPDLt remains low, at a logic level '0', indicating that a '0' is read from the storage cell of the array 36. On the other hand, when a logic level '1' is read from the memory cell, the fan node FT remains at the high level, while the complementary signal on FC falls low. The low level on FC causes P4 to conduct, thereby causing the line BPDLt to be pulled up to the supply voltage VDD. Since FT remains at the high level, PFET P2 does not conduct and the line BPDLc remains low, at a logic level '0'.

In another example, a write operation is performed. The write operation begins with the fan nodes FT and FC being precharged high. The bi-directional primary data lines BPDLt and BPDLc are precharged to ground through NFETs N5 and N6. When a logic level '0' is to be written to the storage array 36, the complementary line BPDLc rises to high, i.e. to logic level '1'. At that time, the write control NFETs N3 and N4 are turned on by write control input WRT. The high level on BPDLc causes N1 to conduct, thereby pulling down the voltage on line FT to ground, i.e. to logic level '0'. The line BPDLt remains at a low potential, such that NFET N2 does not conduct and fan node FC therefore remains at the complementary signal level of high, i.e. at logic level '1'. On the other hand, when a logic level '1' is written to the memory cell, the line BPDLt rises to high, indicating logic level '1'. The high level on BPDLt causes N2 to conduct, which then pulls the voltage of the complementary fan node FC down to ground, i.e. to logic level '0'. At that time, the line BPDLc remains at a low potential, such that NFET N1 does not conduct and fan node FT therefore remains at the supply voltage VDD, i.e. at logic level '1'.

As described in the foregoing, a system and method are provided for transferring data signals between a pair of input output lines coupled to a primary sense amplifier and a pair of bi-directional primary data lines coupled to a second sense amplifier. In such manner, the performance of read and write access to the memory can be improved, as well as the density of the integrated circuit can be increased.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. An integrated circuit memory, comprising:
    a plurality of primary sense amplifiers coupled to provide read and write access to a multiplicity of storage cells;
    a plurality of second sense amplifiers;
    a plurality of pairs of input/output data lines (IODLs), each said input output data line (IODL) pair coupled to a primary sense amplifier of said plurality of primary sense amplifiers, and each said IODL pair adapted to carry first complementary signals representing a storage bit;

a plurality of pairs of bi-directional primary data lines (BPDLs), each said bi-directional primary data line (BPDL) pair coupled to a second sense amplifier of said plurality of second sense amplifiers, and each said BPDL pair adapted to carry second complementary signals representing a storage bit; and a plurality of local buffers each adapted to transfer by converting, in accordance with read control input, said first complementary signals carried by said IODLs to said second complementary signals carried by said BPDLs, and to transfer by converting, in accordance with write control input, said send complementary signals carried by said BPDLs to said first complementary signals carried by said IODLs.

2. The integrated circuit memory of claim 1 wherein each of said local buffers requires no more than eight transistors for transfer of signals in both directions between IODLs and said BPDLs.

3. The integrated circuit memory of claim 1 wherein each of said local buffers includes a pair of IODL precharge transistors, each IODL precharge transistor adapted to conduct current between an IODL of said pair of IODLs and ground, each IODL precharge transistor further being responsive to control input to precharge said IODL to ground.

4. The integrated circuit memory of claim 3 wherein each of said local buffers includes a pair of transistors each responsive to write control input to conduct current between a supply voltage and an IODL, in accordance with the state of a BPDL of said pair of BPDLs coupled to said local buffer.

5. The integrated circuit memory of claim 4 further comprising a plurality of pairs of BPDL precharge transistors, each pair of said plurality of pairs of BPDL precharge transistors coupled to each of said pairs of BPDLs, wherein each said BPDL precharge transistor is coupled to conduct current between a supply voltage and a respective BPDL of said BPDLs, and each further being responsive to precharge control input to precharge said BPDLs to said supply voltage.

6. The integrated circuit memory of claim 4 further comprising a plurality of pairs of BPDL precharge transistors, each pair of said plurality of pairs of BPDL precharge transistors coupled to each of said pairs of BPDLs, wherein each said BPDL precharge transistor is coupled to conduct current between a supply voltage and a respective BPDL of said BPDLs, and each said BPDL precharge transistor further having a gate held at a fixed potential, whereby a signal swing of said BPDLs is less than rail-to-rail.

7. The integrated circuit memory of claim 1 wherein each of said local buffers includes a pair of IODL precharge transistors each adapted to conduct current between a supply voltage and an IODL of said pair of IODLs, and each said IODL precharge transistor further being responsive to control input to precharge said IODL to the supply voltage.

8. The integrated circuit memory of claim 7 wherein each of said local buffers includes a pair of transistors each responsive to write control input to conduct current between an IODL of said pair of IODLs and ground, in accordance with the state of a BPDL of said pair of BPDLs coupled to said local buffer.

9. The integrated circuit memory of claim 8 further comprising a plurality of pairs of BPDL precharge transistors, each pair of said BPDL precharge transistors being coupled to a pair of said BPDLs, wherein each said BPDL precharge transistor is coupled to conduct current between a respective BPDL of said pair of BPDLs and ground, and each said BPDL precharge transistor further being responsive to precharge control input to precharge said BPDLs to ground.

10. The integrated circuit memory of claim 8 further comprising a plurality of pairs of BPDL precharge transistors, each pair of said BPDL precharge transistors being coupled to a pair of said BPDLs, wherein each said BPDL precharge transistor is coupled to conduct current between a respective BPDL of said pair BPDLs and ground, and each said BPDL precharge transistor further having a gate held at a fixed potential, whereby a signal swing of said BPDLs is less than rail-to-rail.

11. An integrated circuit memory, comprising:
a plurality of primary sense amplifiers operatively coupled for access to a multiplicity of storage cells;
a plurality of second sense amplifiers;
a plurality of pairs of input/output data lines (IODLs), each said input output data line (IODL) pair coupled to a primary sense amplifier of said plurality of primary sense amplifiers, and each said IODL pair adapted to carry first complementary signals representing a storage bit, said IODLs adapted to be precharged low;
a plurality of pairs of bi-directional primary data lines (BPDLs), each said bi-directional primary data line (BPDL) pair coupled to a second sense amplifier of said plurality of second sense amplifiers, and each said BPDL pair adapted to carry second complementary signals representing a storage bit, said BPDL pair adapted to be precharged high; and
a plurality of local buffers each adapted to transfer, in accordance with first control input, said first complementary signals carried by said IODLs to said second complementary signals carried by said BPDLs, and to transfer, in accordance with second control input, said second complementary signals carried by said BPDLs to said first complementary signals carried by said IODLs, said local buffers adapted to transfer a data signal between a complementary BPDLc of a BPDL pair to a true input output data line (IODLt) of an IODL pair by inverting a signal appearing on the one to the other.

12. In an integrated circuit memory, a method of transferring a data bit signal between a primary sense amplifier and a secondary sense amplifier, comprising:
providing a pair of input/output data lines (IODLs) coupled to a primary sense amplifier for carrying first complementary data signals;
transferring, in accordance with control input, a data bit signal between said pair of IODLs and a secondary sense amplifier by way of a pair of bi-directional primary data lines (BPDLs) carrying second complementary signals.

13. The method of claim 12 further comprising precharging said IODLs to ground each cycle prior to transferring said data bit signal.

14. The method of claim 13 wherein said transferring comprises pulling up to a supply voltage an input output data line (IODL) of said pair of IODLs, in accordance with write control input and a value of a bi-directional primary data line (BPDL) of said pair of BPDLs.

15. The method of claim 12 further comprising precharging said BPDLs to a supply voltage each cycle prior to transferring said data bit signal.

16. The method of claim 15 wherein said transferring comprises pulling down to ground a voltage of a BPDL of said pair of BPDLs, in accordance with read control input and a value of an IODL of said pair of IODLs.

17. The method of claim 12 further comprising precharging said IODLs to a supply voltage each cycle prior to transferring said data bit signal.

18. The method of claim 17 wherein said transferring comprises pulling down to ground an IODL of said pair of IODLs, in accordance with write control input and a value of a BPDL of said pair of BPDLs.

19. The method of claim 12 further comprising precharging said BPDLs to ground each cycle prior to transferring said data bit signal.

20. The method of claim 19 wherein said transferring comprises pulling up to a supply voltage a voltage of a BPDL of said pair of BPDLs, in accordance with read control input and a value of an IODL of said pair of IODLs.

* * * * *